US006300151B1

(12) United States Patent
Yoon et al.

(10) Patent No.: US 6,300,151 B1
(45) Date of Patent: Oct. 9, 2001

(54) METHOD FOR MANUFACTURING LASER DIODE CHIP, OPTICAL TRANSMITTING/ RECEIVING MODULE AND METHOD FOR ALIGNING POSITIONS THEREOF

(75) Inventors: Euy Sik Yoon; Hong Jun Jun; Ki Chul Shin; Jun Seok Song; Bon Jo Koo; Ho Sung Lee, all of Anyang-shi (KR)

(73) Assignee: LG Cable & Machinery, Ltd., Seoul (KR)

( * ) Notice: Subject to any disclaimer, the term of this patent is extended or adjusted under 35 U.S.C. 154(b) by 0 days.

(21) Appl. No.: 09/401,922

(22) Filed: Sep. 23, 1999

(30) Foreign Application Priority Data

Sep. 24, 1998 (KR) .................................. 98-39767
Dec. 31, 1998 (KR) .................................. 98-63651

(51) Int. Cl.$^7$ .......................... H01L 21/20; H01L 21/461
(52) U.S. Cl. .............................. 438/27; 438/33; 438/462; 438/43; 438/106
(58) Field of Search .................. 438/22, 24, 27, 438/33, 42, 43, 46, 462, 106, 110, 113, 749, 750, 751; 372/43–50; 385/88, 83, 14, 15; 216/2, 24

(56) References Cited

U.S. PATENT DOCUMENTS

| | | | |
|---|---|---|---|
| 4,994,142 | * | 2/1991 | Appelbaum ............................ 438/43 |
| 5,488,678 | * | 1/1996 | Taneya et al. ........................... 385/14 |
| 5,499,732 | * | 3/1996 | Nishimoto ............................... 216/24 |

(List continued on next page.)

Primary Examiner—Savitri Mulpuri
(74) Attorney, Agent, or Firm—Long Aldridge & Norman LLP

(57) ABSTRACT

The present invention relates an optical element used in the field of optical communication and a method for aligning an optical fiber to connect an external optical communication system to the optical element. The present invention relates to an optical transmitting module which consists of a silicon substrate, an optical fiber fixed to the substrate and a laser diode chip, with the first fixing groove for supporting and fixing the optical fiber, with the second fixing groove for supporting and fixing the laser diode chip and with a mediating groove for positioning the optical fiber and the laser diode chip at a definite distance, said mediating groove being formed between the first and the second groove, all those grooves being formed on the top side of said substrate, wherein the first and the second fixing groove are each formed in their predetermined depths on the top side of the substrate so that the central axis of the optical fiber exactly agrees with the center of optical beams from the laser diode chip, the optical fiber and the laser diode chip being received in the first and the second groove, with the result that the relation of mutual positions for the optical fiber and the laser diode chip is precisely determined merely by seating the optical fiber and the laser diode chip in the first and the second groove. Further, the present invention also relates to a method for manufacturing a laser diode chip which comprises the steps of: vapor-depositing a nitride thin film ($Si_3N_4$) on the surface of a wafer on which the n type InP, p type InP, n type InP, p type InP and InGaAs layers are successively laminated with the completion of the tertiary MOCVD growth, and etching the InGaAs layer by using the mixed solution of sulfuric acid, hydrogen peroxide and distilled water after opening an etching window by means of photolithography to form V-mesa and V-grooves; etching an InP layer as a current cut-off layer by using a solution based on a hydrochloric acid; vapor-depositing a nitride thin film(SiNx) by using a PECVD process; opening the electrode forming window to form electrodes by means of a photolithography and forming P type electrodes on the surface of the wafer; forming a N type electrode on the back surface of the wafer after polishing the bottom surface.

4 Claims, 9 Drawing Sheets

U.S. PATENT DOCUMENTS

| | | | |
|---|---|---|---|
| 5,671,315 | * | 9/1997 | Tabuchi et al. ............... 385/137 |
| 5,675,684 | * | 10/1997 | Hirataka et al. ............... 385/88 |
| 5,700,382 | * | 12/1997 | Splett ............................ 216/24 |
| 5,721,797 | * | 2/1998 | Basavanhally ................. 385/49 |
| 5,780,320 | * | 7/1998 | Kinoshita ....................... 438/33 |
| 5,852,624 | * | 12/1998 | Matsuyama et al. .......... 372/44 |
| 5,852,696 | * | 12/1998 | Collins et al. ................. 385/88 |
| 5,909,523 | * | 6/1999 | Sakaino et al. ................ 385/88 |
| 5,976,904 | * | 12/1999 | Gotoh et al. ................... 438/33 |
| 6,042,276 | * | 3/2000 | Tachigori ....................... 385/88 |
| 6,058,234 | * | 5/2000 | Tachigori ....................... 385/49 |
| 6,083,769 | * | 7/2000 | Kurahashi ...................... 438/33 |
| 6,157,759 | * | 12/2000 | Seo et al. ....................... 385/49 |
| 6,168,964 | * | 1/2001 | Hamaguchi ..................... 438/44 |
| 6,181,854 | * | 1/2001 | Kojima et al. ................. 385/49 |

* cited by examiner

METHOD FOR MANUFACTURING LASER DIODE CHIP, OPTICAL TRANSMITTING/ RECEIVING MODULE AND METHOD FOR ALIGNING POSITIONS THEREOF

FIELD OF THE INVENTION

The present invention relates to an optical element used in the field of optical communication and a method for aligning an optical fiber, laser diode chip or photodiode chip to connect an external optical communication system to the optical element.

Particularly, the present invention also relates to a method for manufacturing a laser diode chip which is used to convert electric signals into optical waves in the communication system using optical fibers.

Further, the present invention relates to a method for aligning the positions between a laser diode chip and an optical fiber as well as between a photodiode chip and an optical fiber in the optical fiber communication system.

BACKGROUND OF THE INVENTION

For an optical communication, an optical transmitting module to convert electric signals into optical signals for transmitting as well as an optical receiving module to convert optical signals into electric signals for receiving are essential.

In addition, the art with which a variety of optical elements for generating, detecting, modulating and distributing functions of a light are attached with optical fibers and packaged is essential for commercializing all sorts of communicating elements.

In the process for packaging optical modules, one of the most difficult and costly steps is that of aligning and fixing an optical fiber in the wave guiding path of an optical element which represents a determinant factor for the cost of an optical communication module.

That rests on the difficulty in spatially aligning an optical element and an optical fiber, and holding the both in the aligned position without displacement in view of the very small area for the optical input or output of an optical element in the order of a few square micrometers and also the small area for the optical input or output of an optical fiber in the order of several tens of square micrometers.

The conventional methods for aligning an optical transmitting module and an optical receiving module may be broadly divided into an active aligning method and a passive aligning method.

However, the active aligning method has a difficulty in cost reduction because it needs a long processing time and many parts due to the use of lenses and an expensive laser welder.

On the other hand, the passive aligning methods can be performed without the use of those lenses and laser welders and therefore are coming to the front as new methods for reducing the price of the optical communication modules.

According to a conventional passive aligning method as shown in FIG. 14, after the chip marker 1022 on the bottom surface of a laser diode chip 1010 is caused to match the substrate marker 1014 on the top surface of a substrate 1000, the laser diode chip 1010 is bonded to the metal junction layer 1012 of the silicon substrate 1000 by using a flip chip bonder.

The method using markers as described above is not much more advantageous in the point of the required time for process as compared to the active aligning method and also has a drawback of an increased installation cost for the equipment like a flip chip bonder.

Another conventional passive aligning method is shown in FIG. 15.

In this method, first a support 2040 loaded with a laser diode chip 2010 is fixed bonded on the surface of a substrate 2030 and then mounts 2050 and 2060 are fixed to the substrate 2030. Subsequently, the optical fiber 2020 is caused to be received, with its end close to the laser diode chip 2010, in the groove 2051 formed on the mount 2050 and then the optical fiber 2020 is aligned in its position with regard to the laser diode chip 2010 by adjusting the position of the end of the optical fiber 2020, which end positions on the side of the mount 2050. When the optical fiber 2020 has been precisely aligned in position through those procedures, the optical fiber 2020 is fixed to the mount 2060, for example, through soldering.

For the optical communication module according to FIG. 15 as described above, the positions in which the mounts and the support will be fixed are not exactly determined and therefore a great deal of time is spent to find optimum fixing positions at the time of mounting work. Nevertheless there arise deviations in the fixing positions depending on the individual products because the mounts or the supports are not exactly positioned.

Accordingly, the position alignment operation for the optical fiber with regard to the laser diode chip is not only difficult but the fixing positions of the mounts and supports with unduly high errors can also cause the problem that the optical fiber is not properly lined up with the axis of the laser diode chip.

An improved optical communication module intended to solve the above-described problem is disclosed in the Korean Patent Application No. 1997-044417.

Referring to FIG. 16 concerning the corresponding art, the art is characterized in that the position determining means 3091, 3092 and 3093 to define the positions in which the support 3040 and the mounts 3050 and 3060 are to be fixed are provided.

In particular, the support 3040 on which the laser diode chip 3010 is mounted is inserted into the first position determining groove 3091 on the substrate 3030 and fixed there through bonding or the like. Then, the mount 3050 is inserted into the second position determining groove 3092 and the mount 3060 is inserted into the third position determining groove 3093 on the substrate 3030 and then fixed through bonding.

Subsequently, after the optical fiber 3020 is placed on the mount 2050 with its end close to the laser diode chip 3010 received in the groove 3051, the optical fiber 3020 is brought into a correct position for alignment with the laser diode chip 3010 by adjusting the position of the optical fiber 3020 at its end part on the side of the mount 3050.

When the optical fiber 3020 has been precisely set in its desired position, the optical fiber 3020 is fixed to the mount 3060 through soldering or the like.

Because the support 3040 and the mounts 3050 and 3060 are fixed after they were inserted into their respective position determining grooves 3091, 3092 and 3093 in the assembling operation as described above, even in the case of mass production of optical communication modules, the positions of the support 3040 and the mounts 3050 and 3060 relative to that of the substrate 3030 can always be maintained definite.

SUMMARY OF THE INVENTION

The primary object of the present invention is to provide a process for manufacturing laser diode chips on a large scale, which diodes can be controlled within the order of ±1 micron in the tolerance of size, through an etching step.

The second object of the present invention is to improve the structure of a silicon substrate on which an optical fiber and a laser diode chip are positioned so that the optical fiber and the laser diode chip can be exactly aligned with each other.

The third object of the present invention is to provide a passive aligning method for an optical communication module which permits a precise positioning of an optical fiber and a laser diode chip on a substrate.

The fourth object of the present invention is to reduce the manufacturing cost for an optical communication module by enabling an optical fiber and a laser diode chip to be aligned in a passive manner on a silicon substrate without the use of high-priced bonding equipment.

The fifth object of the present invention is to improve the construction of a silicon substrate on which an optical fiber and a photodiode chip is positioned so that an exact alignment of the optical fiber with the photodiode chip can be achieved.

The sixth object of the present invention is to provide a passive method for aligning an optical receiving module which permits an exact positioning of an optical fiber and a photodiode chip on a silicon substrate.

The seventh object of the present invention is to reduce the cost for manufacturing an optical receiving module through aligning an optical fiber and a photodiode chip on a silicon substrate in a passive manner without the use of an expensive boding equipment.

Finally, the eighth object of the present invention is to improve the exactness of packaging process and to reduce the required time in making the optical transmitting module and the optical receiving module packagable.

The above described objects are achieved by a method for manufacturing a laser diode chip according to an embodiment of the invention which comprises the steps of: (1) vapor-depositing a nitride thin $_{film}$($Si_3N_4$) on the surface of a wafer on which the n type InP, p type InP, n type InP, p type InP and InGaAs layers are successively laminated with the completion of the tertiary MOCVD growth, and etching the InGaAs layer by using the mixed solution of sulfuric acid, hydrogen peroxide and distilled water after opening an etching window by means of photolithography to form V-grooves as cutting sites with a view to control the size of laser diode chip within ±1 micron ; (2) etching an InP layer as a current cut-off layer by using a solution based on a hydrochloric acid; (3) vapor-depositing a nitride thin film (SiNx) by using a PECVD process; (4) opening the electrode forming window to form electrodes by means of a photolithography and forming P type electrodes on the surface of the wafer; (5) forming a N type electrode on the back surface of the wafer after polishing the back surface of the wafer and (6) manufacturing laser diode chips having a desired size by cutting the V-grooves on the chip set with a breaker, when the laser diode chip set with V-grooves is completed through the above described steps of (1) to (5).

The above described objects are also achieved by an optical transmitting module according to another embodiment of the invention which consists of a silicon substrate, an optical fiber fixed to the substrate and a laser diode chip, with the first fixing groove for supporting and fixing the optical fiber, with the second fixing groove for supporting and fixing the laser diode chip and with a mediating groove for positioning the optical fiber and the laser diode chip at a definite distance, said mediating groove being formed between the first and the second grooves, all those grooves being formed on the top side of said substrate, wherein the first and the second fixing groove are each formed in their predetermined depths on the top side of the substrate so that the central axis of the optical fiber exactly may agree with the center of optical beams from the laser diode chip, the optical fiber and the laser diode chip being received in the first and the second groove, with the result that the relation of mutual positions for the optical fiber and the laser diode chip is precisely determined merely by seating the optical fiber and the laser diode chip in the first and the second groove.

The above described objects are also achieved by a method for aligning an optical transmitting module according to another embodiment of the present invention which comprises the steps of: preparing a laser diode chip manufactured by the method defined in Claim 1, in order to form the first fixing groove for fixing an optical fiber, the second fixing groove for fixing a laser diode chip and a mediating groove for connecting the first and the second fixing groove on the top surface of a silicon substrate, forming patterns corresponding to those grooves by using a photolithography, etching the first fixing groove, the second groove and the mediating groove by using potassium hydroxide solution, forming metal patterns on the first fixing groove and the second fixing groove, each formed by etching process, positioning the optical fiber and the laser diode chip in the first and the second fixing groove formed with the metal patterns, followed by fixing of the fiber and the chip.

The above described objects are also achieved by an optical receiving module according to still other embodiment of the present invention which consists of a silicon substrate, an optical fiber fixed to the substrate and a photodiode chip, with the first fixing groove for supporting and fixing the optical fiber, with the second fixing groove for supporting and fixing the photodiode chip and with a mediating groove for positioning the optical fiber and the photodiode chip at a definite distance, said mediating groove being formed between the first and the second groove, all those grooves being formed on the top side of said substrate, wherein the first and the second fixing groove are each formed in their predetermined depths on the top side of the substrate so that the light emitting from the optical fiber can be transmitted to the photodiode chip without loss, with the result that the relation of mutual positions for the optical fiber and the photodiode chip is precisely determined merely by seating the optical fiber and the photodiode chip in the first and the second groove.

The above described objects are also achieved by a method for aligning an optical receiving module according to still other embodiment of the present invention which comprises the steps of: in order to form the first fixing groove for fixing an optical fiber, the second fixing groove for fixing a photodiode chip and a mediating groove for connecting the first and the second fixing groove on the top surface of a silicon substrate, forming patterns corresponding to those grooves by using a photolithography, wherein the pattern for the mediating groove is so formed that the mediating groove extends perpendicular to the optical axis, etching the first fixing groove, the second groove and the mediating groove by using potassium hydroxide solution, wherein the second fixing groove is formed in such a manner that its bottom surface lies a little higher than the base surface of the first fixing groove, forming further a laser beam guiding slot, which extends in line with the first fixing groove and which has its base at the same elevation as the first fixing groove, on the central area of the bottom surface of the second fixing groove, forming metal patterns on the first fixing groove and the second fixing groove, and seating the optical fiber with its bottom surface in the first fixing groove, followed by fixing thereof and seating the photodiode chip with its bottom surface in the laser beam guiding groove, followed by fixing thereof.

The present invention allows the use of simpler equipments and a passive type alignment method for speedy alignment mainly through the enabled control of the size of the laser diode chip within 1 micron thanks to cutting of laser diode chips under the use of etching process.

The present invention, wherein individual laser diode chips are formed from the chip set through a step of etching and V grooves are formed on the silicon substrate for alignment of the laser diode chip, does not need provision of markers for the purpose of alignment as in the conventional art and permits use of an ordinary die bonder for mounting the laser diode chip, whereby the reduction in the required processes and the saving in the installation cost of equipments are achieved.

Furthermore, the present invention, in which a groove is already provided to receive a photodiode chip, contrary to the conventional art, and a direct and ready mounting of a photodiode chip on a silicon substrate is possible, has the advantage of lesser constituting parts and simpler process as compared to the prior art.

Other objects and advantages of the invention will be understood from the following description of some preferred embodiments.

DETAILED DESCRIPTION OF THE INVENTION

The present invention is described below with regard to some preferred embodiments in conjunction with the attached drawings.

It is noted that the following description will be restricted to the parts essential for understanding the construction and function of the invention and so the rest parts will be excluded to clarify the substance of the invention.

A. Manufacture of a laser Diode Chip.

The improvement of the conventional active and passive methods for aligning an optical fiber and a laser diode chip requires an art for controlling the size of a laser diode chip within the controllable range of 1 $\mu$m.

Thus, the inventors of the present invention have developed a process for manufacturing a diode chip which permits controlling the size of a laser diode chip to be a desired size by improving the conventional scribing and breaking processes based on the mechanical cutting of chips.

Figure 1:
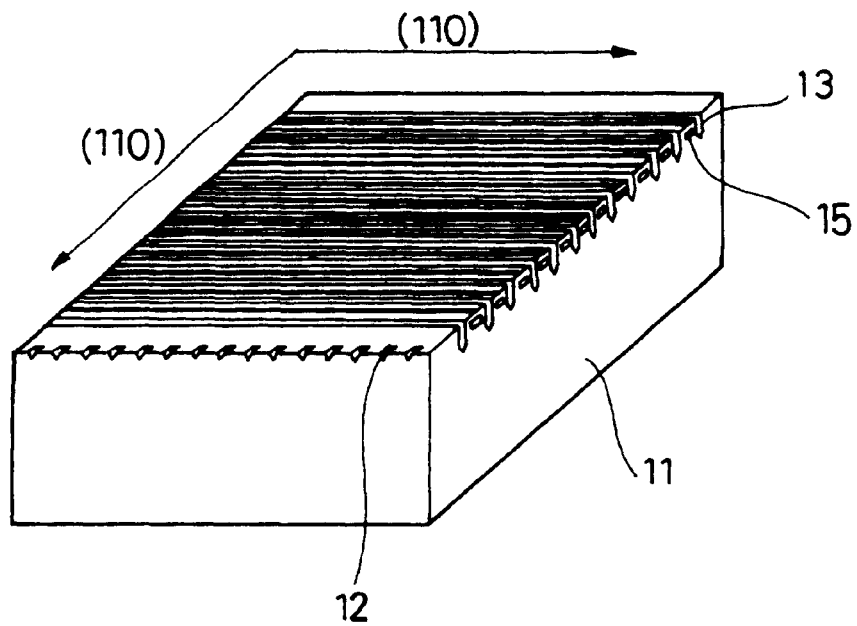
FIG. 1 shows the state of a wafer on which V grooves are etched to manufactor laser diode chips.

According to the present invention, as shown in FIG. 1, in order to manufacture a chip bar from a wafer 11 on which the tertiary MOCVD growth has been completed, V mesas 12 are formed in the direction of <110> on an edge of the wafer through a chemical etching process under the use of mask, instead of the conventional method wherein the scribing is conducted with a diamond cutter in the direction of <110>. And instead of the conventional method wherein the scribing is conducted with a diamond cutter in the direction of <110> to cut chips out from the chip bar, V grooves 13 in almost vertical direction are formed in the direction of <110> through a chemical etching process under the use of mask.

The numeral 15 not mentioned yet stands for the active area.

The manufacturing process for a laser diode chip according to the invention will be described below with reference to FIGS. 2 through 7.

A P type InP 18, N type InP 19, and P type InP 20 layers are successively formed on a N type InP substrate 17 by means of MOCVD process and subsequently an InGaAs layer 21 is vapor-deposited on the surface of the layer 20.

When the tertiary MOCVD growth has been finished as described above, a $Si_3N_4$ thin film 22 is vapor-deposited on the InGaAs layer 21. When the deposition of the nitride thin film 22 is completed, the etching window for etching V mesas and V grooves is opened with the photolithography process.

The V grooves 13 described in the foregoing serve as cutting sites at which cutting takes place to produce individual laser diode chip with the desired size.

The process is described in detail step by step by referring to FIGS. 2 to 6.

Figure 2:
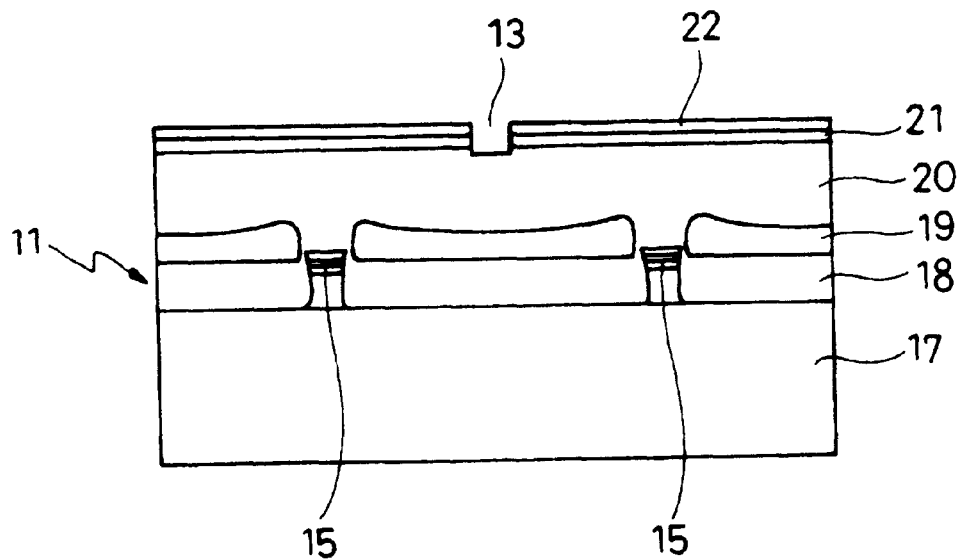
FIGS. 2 through 6 show the processing steps to manufacture laser diode chips.
Figure 3:
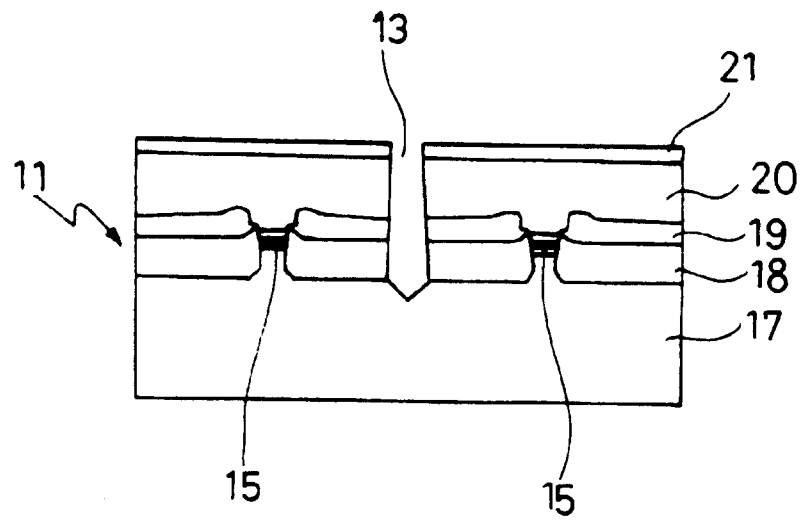
Figure 4:
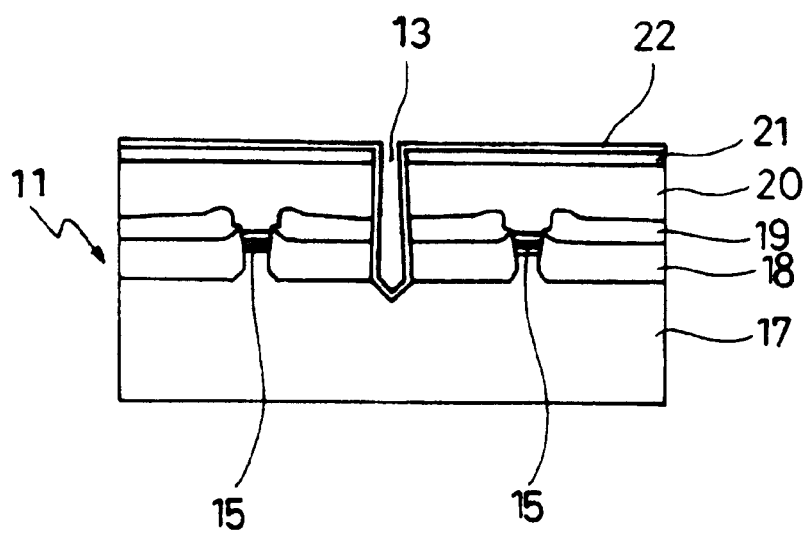
Figure 5:
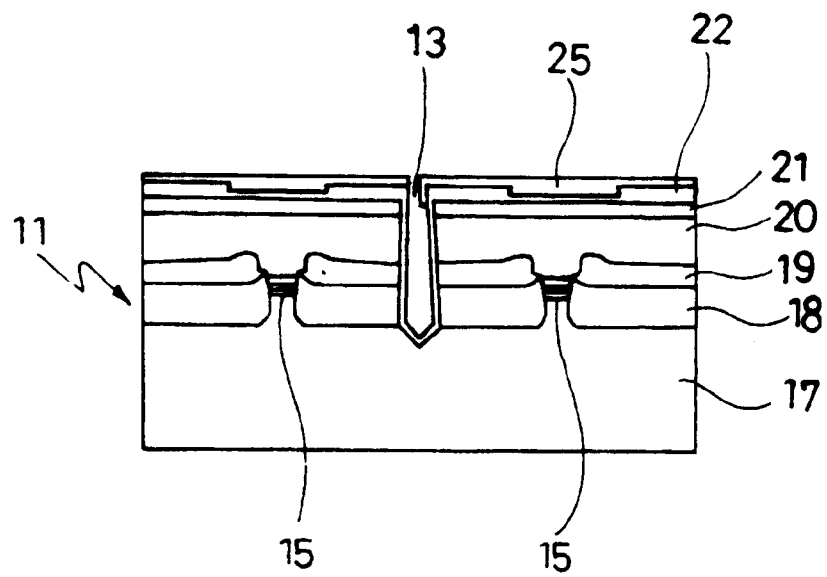
Figure 6:
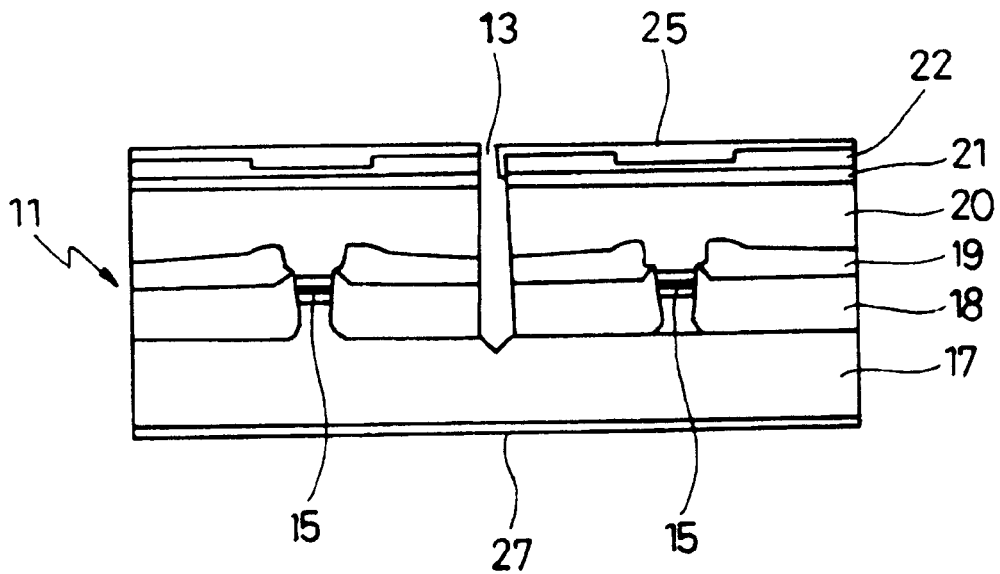
Figure 7:
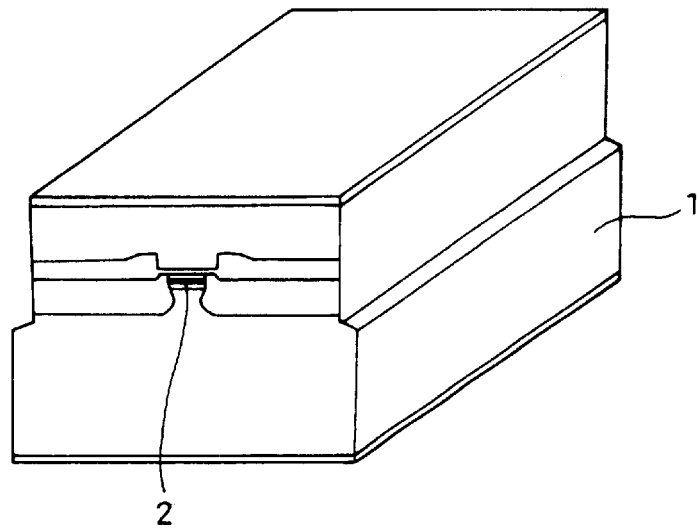
FIG. 7 shows the perspective view of a laser diode chip manufactured according to the invention.

When the etching window is opened, a part of the InGaAs layer 21 on the top of the substrate is removed with the mixed solution of sulfuric acid, hydrogen peroxide and distilled water.(Refer to FIG. 2).

With the completion of etching for the InGaAs layer, a part of the InP layers 18, 19 and 20 as current cut-off layers are etched off by using a solution based on hydrochloric acid. (Refer to FIG. 3).

After the InP layers 18, 19 and 20 are etched, the nitride thin film in the form of $SiN_x$ 22 is deposited in the PECVD process. (Refer to FIG. 4).

With the nitride thin film 22 deposited, the photolithography is employed to open the etching window for forming electrodes and P type electrodes 25 are formed. (Refer to FIG. 5).

With the P type electrodes 25 formed, the wafer is polished on its back surface to be provided with a N type electrode 27. (Refer to FIG. 6).

When both the P type electrode and the N type electrodes are finished, the wafer is divided into respective chips through a breaking process, whereby the laser diode chips which have been subjected to the control in the size are completed. A finished laser diode chip is illustrated in a perspective view in FIG. 7.

B. Method for Aligning an Optical Transmitting Module and an Optical Transmitting Module.

Figure 8:
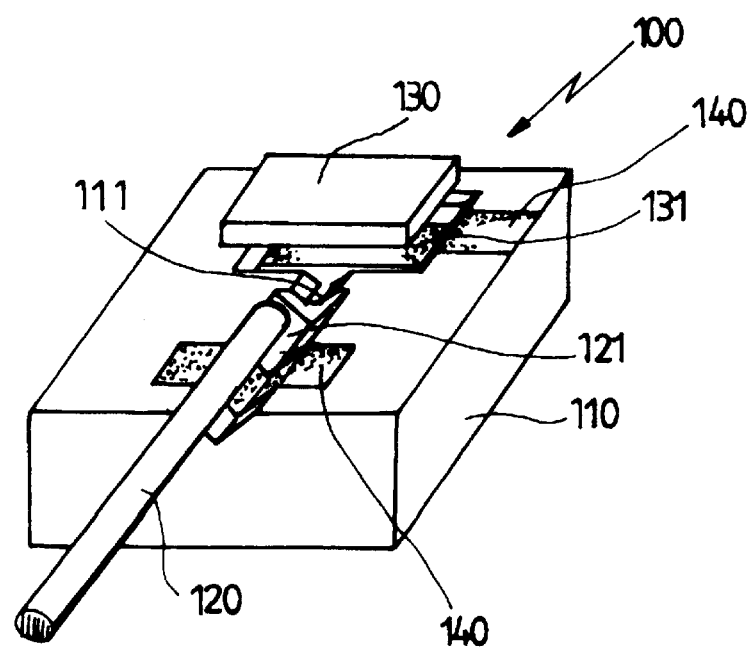
FIG. 8 shows the arrangement of an optical transmitting module, illustrating the optical fiber is aligned, according to an embodiment of the invention.

FIG. 8 shows an external perspective view of an optical transmitting module according to the invention.

The optical transmitting module 100 consists of a silicon substrate 110, the first fixing groove 121 formed on the substrate, the second fixing groove 131, a mediating groove 111, a laser diode chip 130 as an optical source and an optical fiber 120 for providing a wave path.

The first fixing groove 121 is intended to retain the optical fiber and the second fixing groove 131 is intended to retain the laser diode chip as an optical source.

The mediating groove 111 is formed between the first and the second fixing groove 121 and 131 to keep apart the optical fiber 120 and the laser diode chip 130 at a definite distance.

The first fixing groove 121 and the mediating groove 111 are both substantially in V form but the former is bored deeper than the latter.

As for the second fixing groove 131, the dimension of its base corresponds to that of the bottom surface of the laser diode chip, its top width is larger than its bottom width and its base surface is flat so that the bottom surface of the diode chip may be stably received. Thus side walls of the second fixing groove 131 are inclined inwardly with depth.

Particularly, it was found that the inclination of the side walls of the second fixing groove 131 at about 54.7° relative to the vertical line is preferable.

The first and the second fixing groove 121 and 131 face each other, with the mediating groove 111 interposed therebetween.

The first and the second fixing groove 121 and 131 are aligned in the same line or in the same vertical plane so that the light beams emitted from the laser diode chip 130 can be input into the optical fiber 120 without any loss.

The numeral 140 not mentioned so far indicates a metal pattern layer.

The laser diode chip 130 which was made according to the manufacturing process depicted in FIGS. 2 through 6 is adjusted to be constant in its width.

Figure 9:
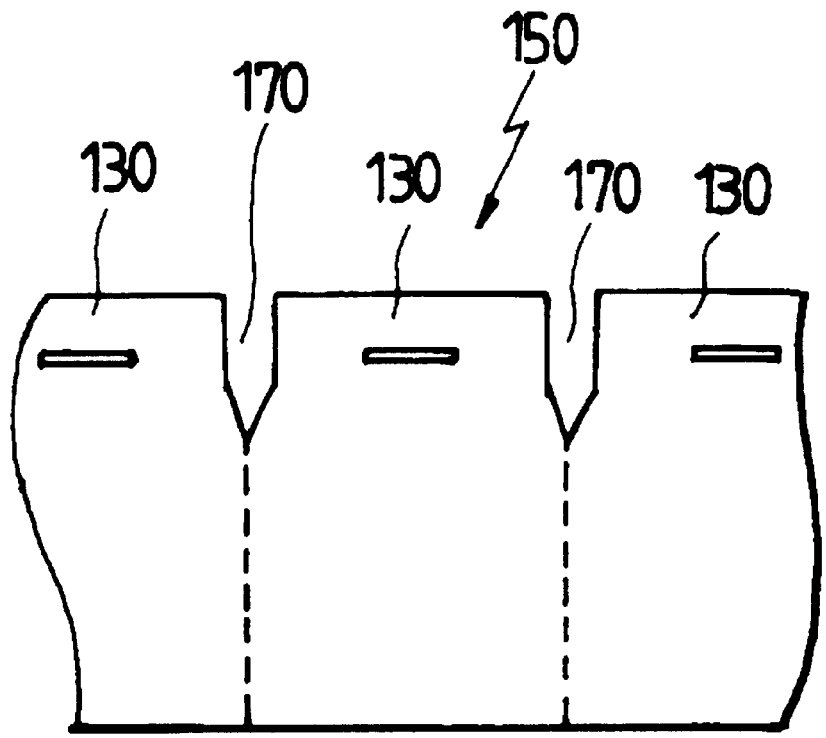
FIG. 9 shows a set of laser diode chips before cutting, featuring V-grooves according to the invention.

Referring to FIG. 9, the cutting sites 170 in V form with a predetermined width and depth are formed through an etching process on the diode chip sets 150 for precise control of the width of laser diode chips while the diode chips were usually divided by means of a scriber in the prior art.

As the etchant, the hydrochloric acid based solution is used, and the etching depth is decided in the range of ca. 3–5 $\mu$m.

Thus, when an external stress is acted on a cutting site 170 formed on the laser diode chip set 150, a shear force is generated along the dotted line extended down from the notch, as shown in the drawing, whereby the individual laser diode chips 130 with a preset size are provided through breaking at each notch site.

Figure 10:
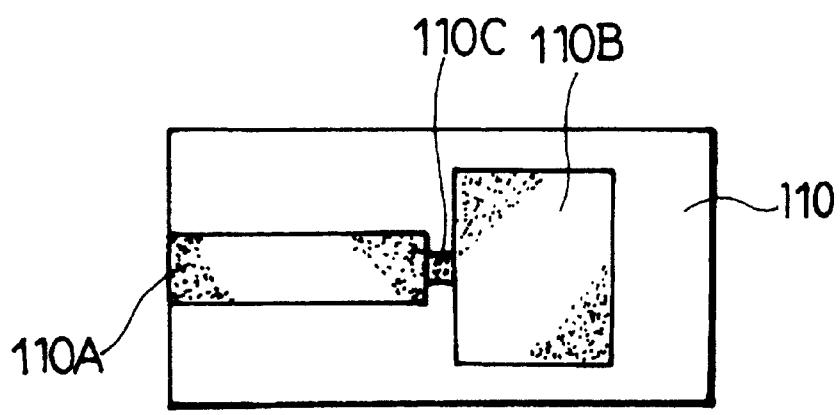
FIG. 10 shows the arrangement of patterns for etching, to be applied in an optical transmitting module according to the invention.
Figure 11:
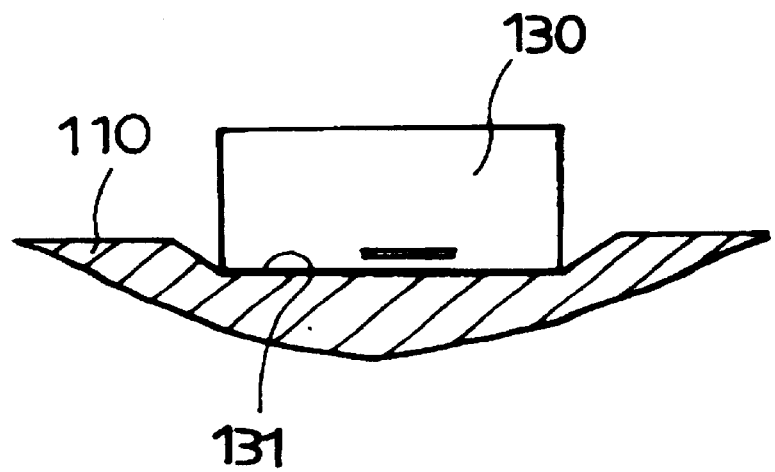
FIG. 11 shows the mounted state for a laser diode chip, to be applied in an optical transmitting module according to the invention.

Next, the process for providing the laser diode chip 130 and the optical fiber 120 on a silicon substrate 110 is described by referring to FIGS. 10 and 11.

When the silicon nitride thin film is coated by the plasma enhanced chemical vapor deposition (PECVD) under the use of masking on the top surface of silicon substrate 110, an optical fiber pattern area 110A for the position of the optical fiber 120, a laser diode chip pattern area 110B for the place of the laser diode chip 130 and a mediating groove pattern area 110C to space the optical fiber 120 and the laser diode chip 130 are formed.

Then, on the respective pattern areas 110A, 110B and 110C, the first and second fixing grooves 121 and 131 as well as the mediating groove 111 are formed by an etching process using KOH solution.

As described previously, preferably the second fixing groove 131 for receiving the laser diode chip 130 is so shaped that its base width coincides with that of the bottom surface of the laser diode chip 130 in the etching step.

Further, as the inner side walls of the second fixing groove is inclined at a definite angle, enabled by the anisotropic property of silicon, favorably for receiving a chip, a precise mounting of the laser diode chip 130 is realized even with a usual die bonder. (Refer to FIG. 11).

Now, a mere placing of the optical fiber 120 and the laser diode chip 130 on the corresponding first and second fixing grooves 121 and 131 of the silicon substrate 110 means the completion of the desired alignment of the optical fiber 120 and the laser diode chip 130.

Therefore, the aligning method according to the present invention eliminates the need for troublesome matching of the alignment markers and the use of the expensive flip chip bonder in the conventional art.

Moreover, the use of the laser diode chips 130 which were clearly cut following etching step permits the precise mounting, whether the epi-surface faces downward or upward.

C. Method for Aligning an Optical Receiving Module and an Optical Receiving Module.

Figure 12:
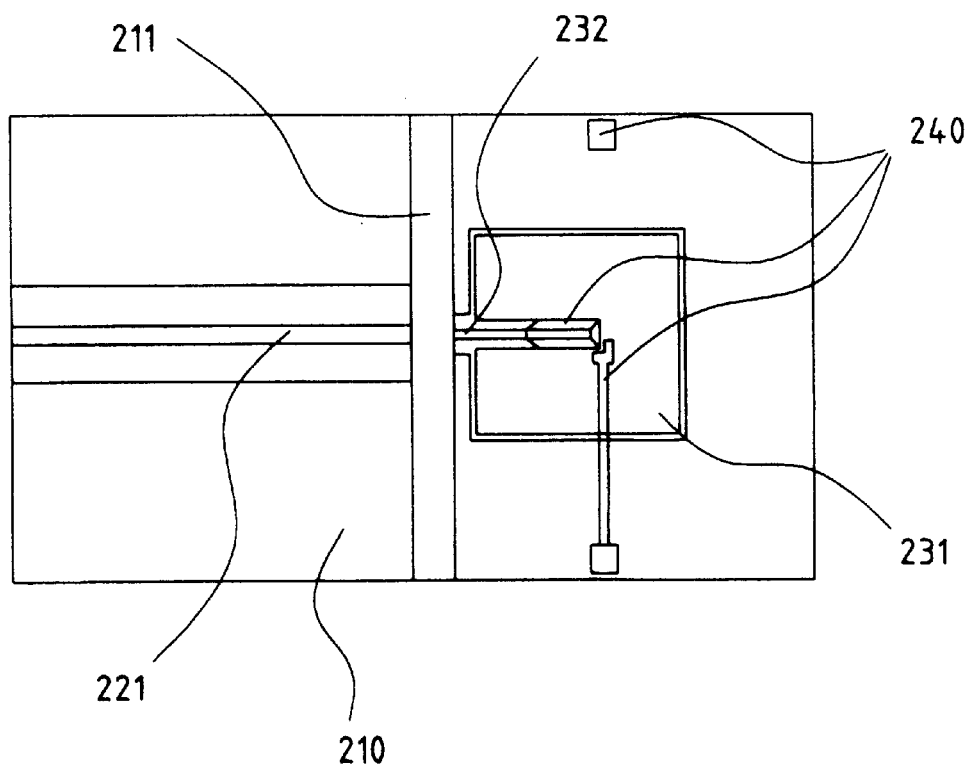
FIG. 12 shows a plan view of a silicon substrate to be used in an automatic aligning and mounting method for a photodiode chip according to an embodiment of the invention.
Figure 13:
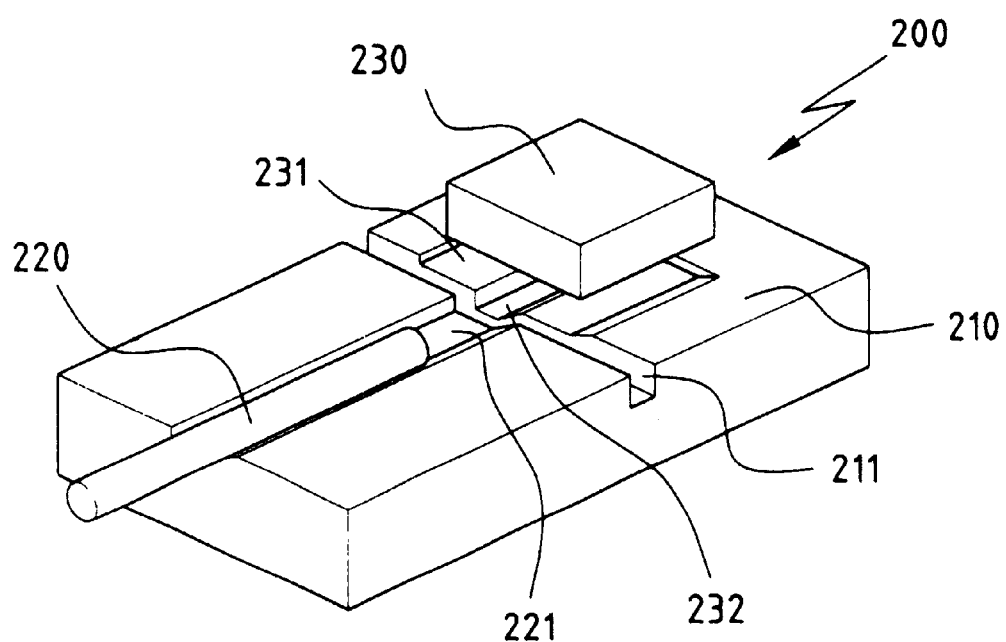
FIG. 13 shows a perspective view of an optical receiving module according to the invention.
Figure 14:
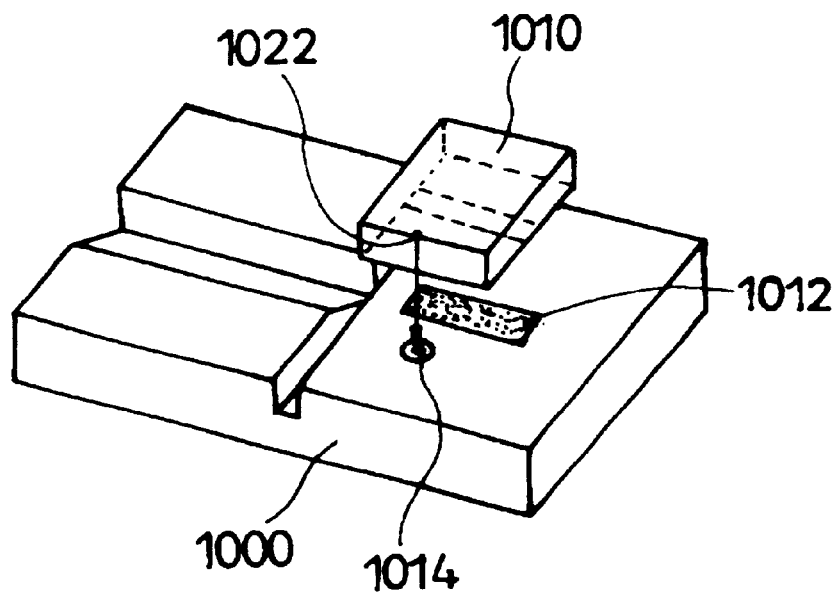
FIG. 14 shows a silicon substrate and a laser diode chip before the alignment according to a conventional art.
Figure 15:
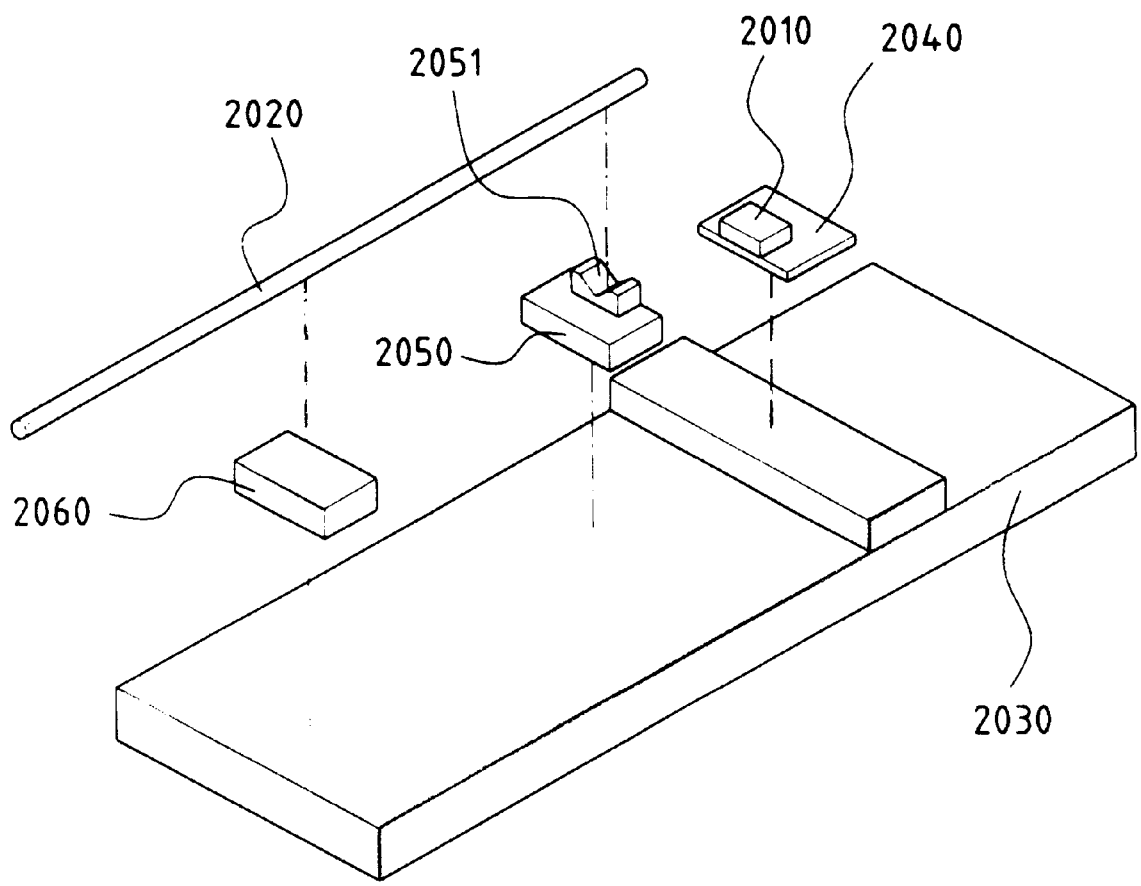
FIG. 15 shows schematically the exploded perspective view of a conventional optical communication module and FIG. 16 shows schematically the exploded perspective view of another conventional optical communication module.
Figure 16:
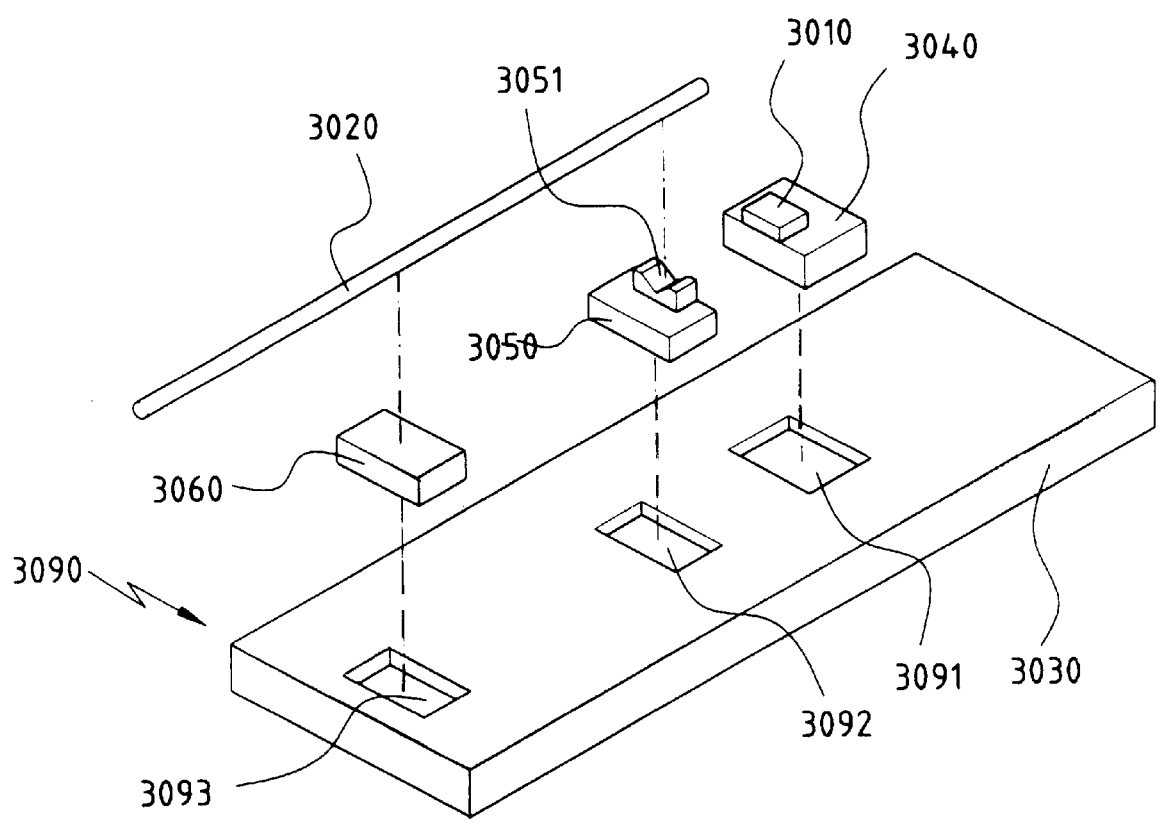

FIG. 12 shows a plan view illustrating a method for automatically aligning and mounting the optical detector of an optical receiving module for optical communication according to the present invention. FIG. 13 shows a perspective view of the optical receiving module according to the present invention.

Referring to FIGS. 12 and 13, the embodiment of optical receiving module includes the first fixing groove 221 for mounting an optical fiber on a silicon wafer 210, a mediating groove 211 which extends at the right angle to the first fixing groove and which has its base surface positioned a little lower than the first fixing groove, the second fixing groove 231 in a rectangular form behind the mediating groove, with its base surface positioned a little higher than the first fixing groove and a laser beam guiding slot 232 which extends, at the right angle to the mediating groove and in line with the first fixing groove 221, up to the central area of the second fixing groove 231 and which has its base at about the same elevation as the first fixing groove 221 and which is gold-plated.

The numeral 240 stands for the gold-plated area through metal patterning.

FIGS. 12 and 13 illustrate the construction of consisting of the second fixing groove 231 for seating the photodiode chip 230 and an additional laser beam guiding slot 232 for guiding the incidence of the light emitting from the optical fiber 220 into the photodiode chip 230.

The manufacture of such a structure needs two steps of at first, etching the first fixing groove 221 for an optical fiber on the silicon substrate 210 and next, etching the second fixing groove 231 for receiving a photodiode chip 230.

In preparing such a silicon substrate, the photolithography process with masks having desired patterns and the etching process with KOH solution are employed.

As the light receiving window of a photodiode chip 230 usually has a diameter of 70–80 microns in size, the laser beam guiding slot 232 for guiding the light from an optical fiber 220 should have its top width which is larger than the size of the light receiving window.

As the masking material, the silicon nitride thin film deposited through PECVD growth is used, and as the corresponding etchant for silicon, potassium hydroxide solution is used. Because the control on the groove size is most important in etching a V type groove or slot, the concentration and temperature of the etching solution and the stirring state of the solution should be carefully regulated.

The metal layer 240 for mounting the photodiode chip 230 and the optical fiber 220 on the silicon substrate 210 so prepared is then vapor-deposited before those chip and fiber are mounted.

As in the former embodiments, it is possible to mount the photodiode chip in an exact place with an ordinary die bonder because the V type groove of the diode chip has the configuration fitted to stably retain the diode chip, including the features of tapering cross section for the bore with the inner side walls inclined inwardly 54.7° with the depth and the base of the groove matching with the bottom surface of the laser diode chip.

It is to be understood that, while the invention was described with respect to some specific embodiments, the invention is never restricted to those embodiments and a variety of modifications and alterations would be possible to a man skilled in the art by referring to the description or drawings presented here and within the spirit of the invention and thus those modifications or alterations are to fall within the scope of the invention, which scope should be limited only by the attached claims.

What is claimed is:

1. A method for manufacturing a laser diode chip comprising the steps of:

(1) vapor-depositing a nitride thin film(Si3N4) on the surface of a wafer on which the n type InP, p type InP, n type InP, p type InP and InGaAs layers are successively laminated with the completion of the tertiary MOCVD growth, and etching the InGaAs layer by using the mixed solution of sulfuric acid, hydrogen peroxide and distilled water after opening an etching window by means of photolithography to form V-grooves as cutting sites with a view to control the size of laser diode chip within ±1 micron;

(2) etching a part of InP layer as a current cut-off layer by using a solution based on a hydrochloric acid;

(3) vapor-depositing a nitride thin film(SiNx) by using a PECVD process;

(4) opening the electrode forming window to form electrodes by means of a photolithography and forming P type electrodes on the surface of the wafer;

(5) forming a N type electrode on the back surface of the wafer after polishing the bottom surface and (6) manufacturing laser diode chips having a desired size by cutting the V-grooves on the chip set with a breaker, when the laser diode chip set with V-grooves is completed through the above described steps of (1) to (5).

2. A method for aligning an optical transmitting module comprising the steps of:

preparing a laser diode chip manufactured by the method defined in claim 1, in order to form the first fixing groove for fixing an optical fiber, the second fixing groove for fixing a laser diode chip and a mediating groove for connecting the first and the second fixing groove on the top surface of a silicon substrate, forming patterns corresponding to those grooves by using a photolithography;

etching the first fixing groove, the second groove and the mediating groove by using potassium hydroxide solution;

forming metal patterns on the first fixing groove and the second fixing groove, each formed by etching process; and positioning the optical fiber and the laser diode chip in the first and the second fixing groove formed with the metal patterns, followed by fixing of the fiber and the chip.

3. The method according to claim 2, wherein said second fixing groove has its base which corresponds in size to the bottom surface of the laser diode chip, is smaller in size in comparison to the top width of the groove and is formed flat to stably receive the laser diode chip.

4. A method for aligning an optical receiving module comprising the steps of:

forming patterns corresponding to those grooves by using a photolithography, wherein the pattern for the mediating groove is so formed that the mediating groove extends perpendicular to the optical axis, in order to form the first fixing groove for fixing an optical fiber, the second fixing groove for fixing a photodiode chip and a mediating groove for connecting the first and the second fixing groove on the top surface of a silicon substrate;

etching the first fixing groove, the second groove and the mediating groove by using potassium hydroxide solution, wherein the second fixing groove is formed in such a manner that its bottom surface lies a little higher than the base surface of the first fixing groove;

forming further a laser beam guiding slot, which extends in line with the first fixing groove and which has its base at the same elevation as the first fixing groove, on the central area of the base of the second fixing groove;

forming metal patterns on the first fixing groove and the second fixing groove; and seating the optical fiber with its bottom in the first fixing groove, followed by fixing thereof and seating the photodiode chip with its bottom surface in the laser beam guiding groove, followed by fixing thereof.

* * * * *